(12) United States Patent
Chen et al.

(10) Patent No.: US 6,873,006 B2
(45) Date of Patent: Mar. 29, 2005

(54) SEMICONDUCTOR MEMORY ARRAY OF FLOATING GATE MEMORY CELLS WITH BURRIED FLOATING GATE AND POINTED CHANNEL REGION

(75) Inventors: Bomy Chen, Cupertino, CA (US); Ying Kit Tsui, Cupertino, CA (US); Wen-Juei Lu, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 35 days.

(21) Appl. No.: 10/393,896

(22) Filed: Mar. 21, 2003

(65) Prior Publication Data

US 2004/0183118 A1 Sep. 23, 2004

(51) Int. Cl.$^7$ .............................................. H01L 29/788
(52) U.S. Cl. ....................... 257/316; 257/317; 257/622; 438/689
(58) Field of Search ................................ 257/316, 317, 257/321

(56) References Cited

U.S. PATENT DOCUMENTS

| | | |
|---|---|---|
| 4,757,360 A | 7/1988 | Farone |
| 4,794,565 A | 12/1988 | Wu et al. |
| 4,882,707 A | 11/1989 | Mizutani |
| 4,905,062 A | 2/1990 | Esquivel et al. |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,049,959 A * | 9/1991 | Satoh ........................ 257/301 |
| 5,051,793 A | 9/1991 | Wang |
| 5,101,250 A | 3/1992 | Arima et al. |
| 5,268,319 A | 12/1993 | Harari |
| 5,386,132 A * | 1/1995 | Wong ......................... 257/316 |
| 5,429,965 A | 7/1995 | Shimoji |
| 5,544,103 A | 8/1996 | Lambertson |
| 5,572,054 A * | 11/1996 | Wang et al. ................. 257/322 |
| 5,780,341 A | 7/1998 | Ogura |
| 5,780,892 A | 7/1998 | Chen |
| 5,786,612 A * | 7/1998 | Otani et al. ................. 257/316 |
| 5,789,293 A | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 6,091,104 A | 7/2000 | Chen |
| 6,103,573 A | 8/2000 | Harari et al. |
| 6,130,453 A * | 10/2000 | Mei et al. .................... 257/315 |
| 6,140,182 A | 10/2000 | Chen |
| 6,222,227 B1 | 4/2001 | Chen |
| 6,262,917 B1 * | 7/2001 | Lee ........................ 365/185.33 |
| 6,525,371 B2 | 2/2003 | Johnson |

* cited by examiner

Primary Examiner—Gene M. Munson
(74) Attorney, Agent, or Firm—DLA Piper Rudnick Gray Cary US LLP

(57) ABSTRACT

A method of forming an array of floating gate memory cells, and an array formed thereby, wherein a trench is formed into a surface of a semiconductor substrate. The source region is formed underneath the trench, the drain region is formed along the substrate surface, and the channel region therebetween includes a first portion extending vertically along the trench sidewall and a second portion extending horizontally along the substrate surface. The floating gate is disposed in the trench adjacent to and insulated from the channel region first portion. The control gate is disposed over and insulated from the channel region second portion. The trench sidewall meets the substrate surface at an acute angle to form a sharp edge. The channel region second portion extends from the second region in a direction toward the sharp edge and the floating gate to define a path for programming the floating gate with electrons via hot electron injection.

29 Claims, 13 Drawing Sheets

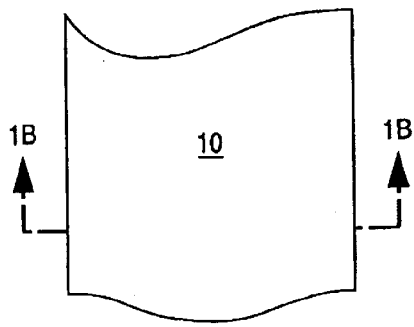
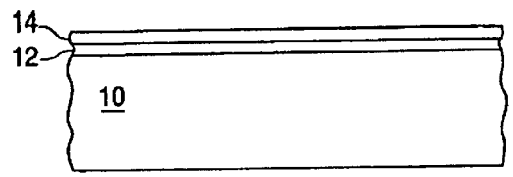
FIG. 1A
FIG. 1B
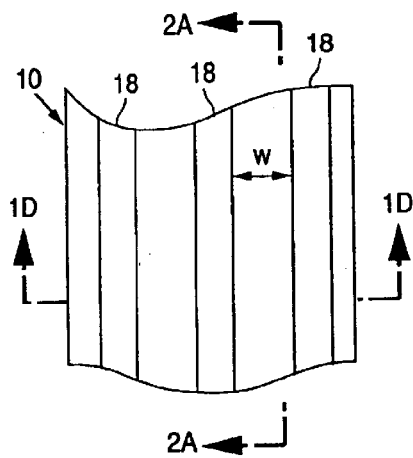
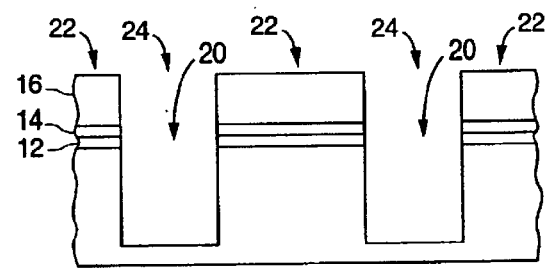
FIG. 1D
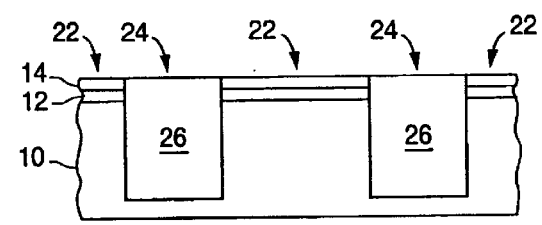
FIG. 1C
FIG. 1E
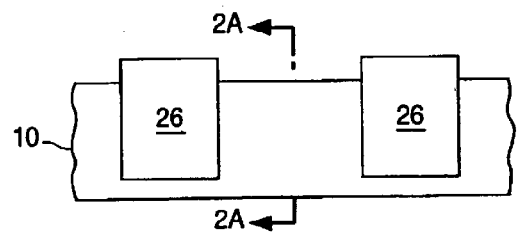
FIG. 1F

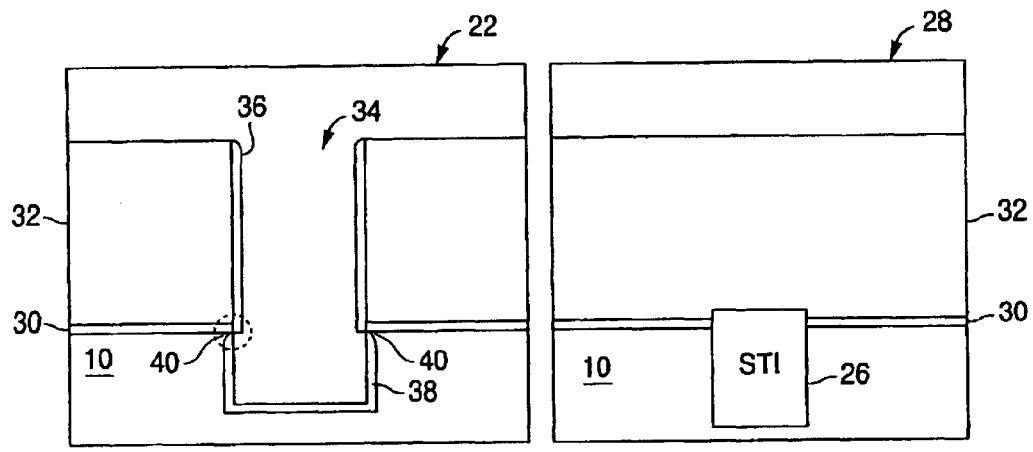
FIG. 2C FIG. 3C
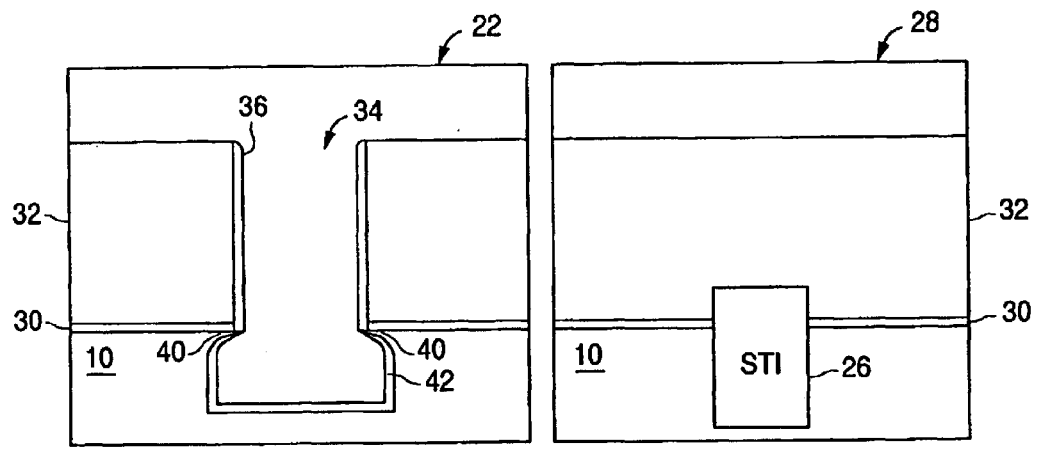
FIG. 2D FIG. 3D

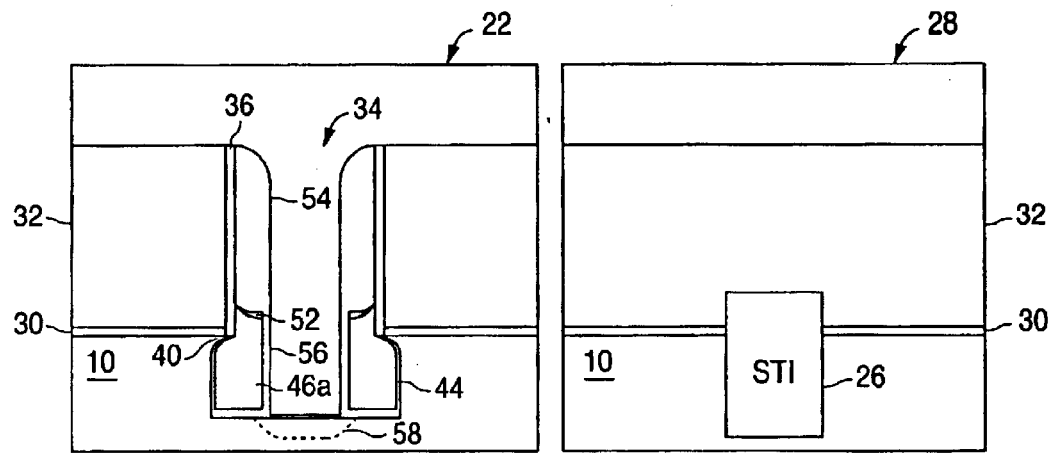
FIG. 2M     FIG. 3M
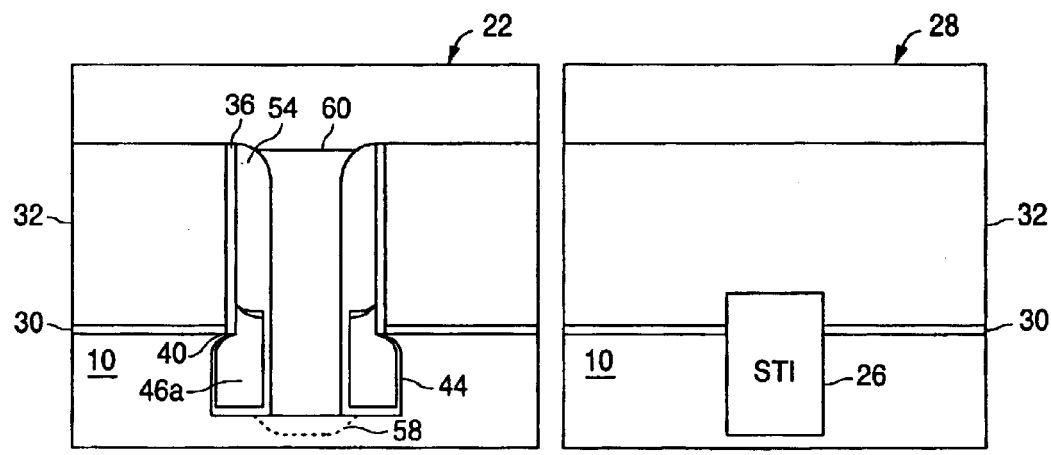
FIG. 2N     FIG. 3N

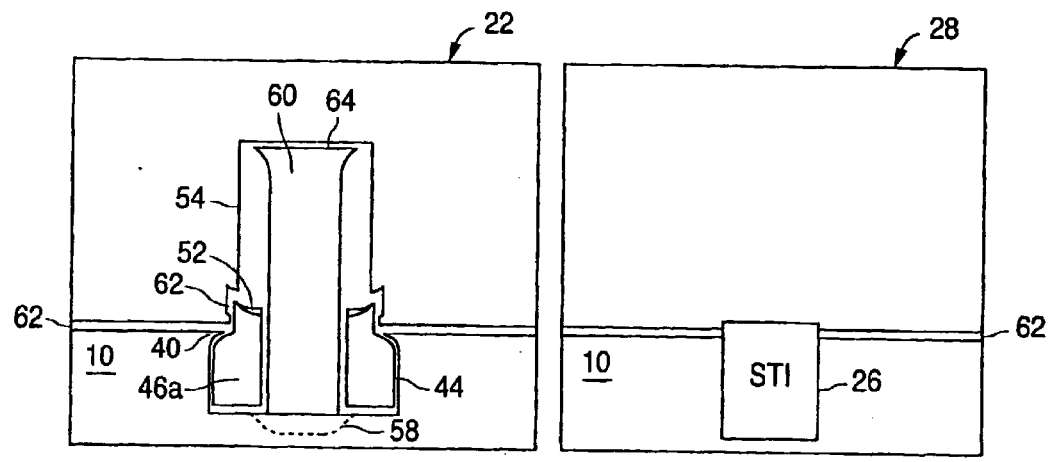
FIG. 2O
FIG. 3O
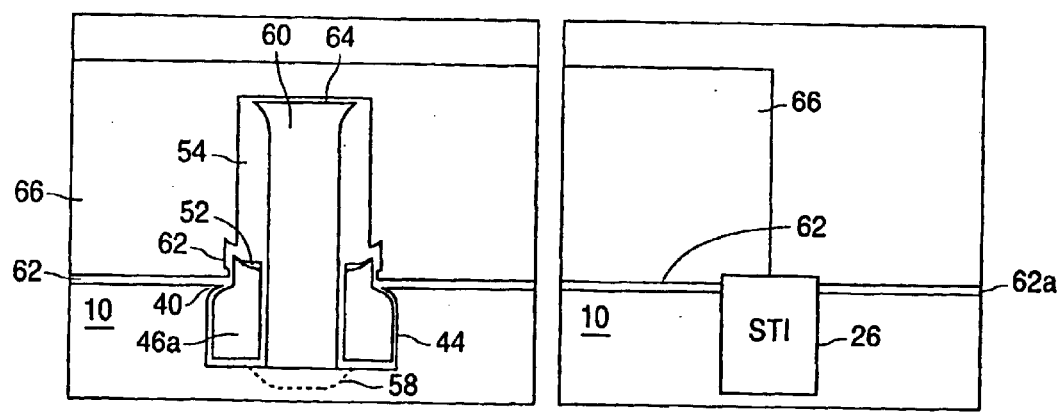
FIG. 2P
FIG. 3P

SEMICONDUCTOR MEMORY ARRAY OF FLOATING GATE MEMORY CELLS WITH BURRIED FLOATING GATE AND POINTED CHANNEL REGION

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

There is a constant need to shrink the size of the memory cell arrays in order to maximize the number of memory cells on a single wafer. It is well known that forming memory cells in pairs, with each pair sharing a single source region, and with adjacent pairs of cells sharing a common drain region, reduces the size of the memory cell array. However, a large area of the array is typically reserved for the bit-line connection to the drain regions. The bit-line area is often occupied by the contact openings between memory cell pairs, and the contact to wordline spacing, which strongly depends upon lithography generation, contact alignment and contact integrity. In addition, significant space is reserved for the word-line transistor, the size of which is set by lithography generation and junction scaling.

Traditionally, floating gates are formed with a sharp edge facing a control gate to enhance Fowler-Nordheim tunneling, which is used to move electrons off of the floating gate during an erase operation. The sharp edge is typically formed by oxidizing or partially etching the top surface of the floating gate poly in an uneven manner. In order to enhance the oxidation process, the floating gate poly is typically lightly doped to avoid the formation of large grains. However, as the dimensions of the floating gate get smaller, the grains of the polysilicon (which are enlarged due to the thermal cycles of the oxidation process) become significant in size compared to the overall size of the floating gate. The large grain size relative to the size of the floating gate causes the sharp edge to be unevenly formed, which compromises the operation and functionality of the floating gate.

There is also a need to improve the programming efficiency of memory cell array. In conventional programming schemes, the electrons in the channel region flow in a path parallel to the floating gate, where a relatively small number of the heated electrons are injected onto the floating gate. The estimated program efficiency (number of electrons injected compared to total number of electrons) is estimated at about $1/1000$.

There is a need for a non-volatile, floating gate type memory cell array with significant cell size reduction while providing enhanced programming efficiency.

SUMMARY OF THE INVENTION

The present invention solves the above mentioned problems by providing a self aligned method of forming memory cells with reduced size and novel structure, and a memory cell array formed thereby.

The present invention is an electrically programmable and erasable memory device that includes a substrate of semiconductor material having a first conductivity type and a surface, a trench formed into the surface of the substrate, wherein the trench includes a sidewall that meets the substrate surface at an acute angle to form a sharp edge, first and second spaced-apart regions formed in the substrate and having a second conductivity type, with a channel region formed in the substrate therebetween, wherein the first region is formed underneath the trench, and the channel region includes a first portion that extends substantially along the trench sidewall and a second portion that extends substantially along the substrate surface, an electrically conductive floating gate having at least a lower portion thereof disposed in the trench adjacent to and insulated from the channel region first portion, and an electrically conductive control gate disposed over and insulated from the channel region second portion. The channel region first and second portions are non-linear with respect to each other, with the channel region second portion extending from the second region in a direction toward the sharp edge and the floating gate to define a path for programming the floating gate with electrons via hot electron injection.

In another aspect of the present invention, an electrically programmable and erasable memory device includes a substrate of semiconductor material having a first conductivity type and a surface, a trench formed into the surface of the substrate, wherein the trench includes a sidewall that meets the substrate surface at an acute angle to form a sharp edge, first and second spaced-apart regions formed in the substrate and having a second conductivity type, with a channel region formed in the substrate therebetween, wherein the first region is formed underneath the trench, and the channel region includes a first portion that extends substantially along the trench sidewall and a second portion that extends substantially along the substrate surface, an electrically conductive floating gate having at least a lower portion thereof disposed in the trench adjacent to and insulated from the channel region first portion, and an electrically conductive control gate disposed over and insulated from the channel region second portion. The sharp edge is formed by the process of forming a first oxide layer on the trench sidewall via oxidation, removing the first oxide layer, and forming a second oxide layer on the trench sidewall via oxidation. The channel region first and second portions are non-linear with respect to each other, with the channel region second portion extending from the second region in a direction toward the sharp edge and the floating gate to define a path for programming the floating gate with electrons via hot electron injection.

In yet another aspect of the present invention, an array of electrically programmable and erasable memory devices includes a substrate of semiconductor material having a first conductivity type and a surface, spaced apart isolation regions formed on the substrate which are substantially parallel to one another and extend in a first direction, with an active region between each pair of adjacent isolation regions, and each of the active regions including a plurality of pairs of memory cells. Each of the memory cell pairs includes a trench formed into the surface of the substrate and including a pair of opposing sidewalls that meet the substrate surface at acute angles to form a pair of sharp edges, a first region formed in the substrate underneath the trench, a pair of second regions formed in the substrate, with a pair of channel regions each formed in the substrate between the first region and one of the second regions, wherein the first and second regions have a second conductivity type, and wherein each of the channel regions includes a first portion that extends substantially along one of the opposing trench sidewalls and a second portion that extends substantially along the substrate surface, a pair of electrically conductive floating gates each having at least a lower portion thereof disposed in the trench adjacent to and insulated from one of the channel region first portions, and a pair of electrically conductive control gates each disposed over and insulated from one of the channel region second portions. For each of the channel regions, the channel region first and second portions are non-linear with respect to each other, with the channel region second portion extending from one of the second regions in a direction toward one of the sharp edges and one of the floating gates to define a path for programming the one floating gate with electrons via hot electron injection.

In yet one more aspect of the present invention, a method of forming a semiconductor memory cell includes forming a trench into a surface of a semiconductor substrate, wherein the substrate has a first conductivity type and the trench includes a sidewall, modifying a shape of the trench sidewall so that the trench sidewall meets the substrate surface at an acute angle to form a sharp edge, forming first and second spaced-apart regions of a second conductivity type in the substrate with the first region formed underneath the trench, wherein a channel region is defined in the substrate between the first and second regions such that the channel region includes a first portion that extends substantially along the trench sidewall and a second portion that extends substantially along the substrate surface, forming an electrically conductive floating gate having at least a lower portion thereof disposed in the trench adjacent to and insulated from the channel region first portion, forming an electrically conductive control gate disposed over and insulated from the channel region second portion. The channel region first and second portions are non-linear with respect to each other, with the channel region second portion extending from the second region in a direction toward the sharp edge and the floating gate to define a path for programming the floating gate with electrons via hot electron injection.

In a further aspect of the present invention, a method of forming an array of electrically programmable and erasable memory devices includes forming spaced apart isolation regions on a semiconductor substrate that are substantially parallel to one another and extend in a first direction, with an active region between each pair of adjacent isolation regions, wherein the substrate has a surface and a first conductivity type, and forming a plurality of pairs of memory cells in each of the active regions. The formation of each of the memory cell pairs includes forming a trench into the surface of the substrate, wherein the trench has a pair of opposing sidewalls, modifying a shape of the trench sidewalls so that the trench sidewalls meet the substrate surface at an acute angle to form a pair of sharp edges, forming a first region in the substrate and underneath the trench, forming a pair of second regions in the substrate, with a pair of channel regions each defined in the substrate between the first region and one of the second regions, wherein the first and second regions have a second conductivity type, and wherein each of the channel regions includes a first portion that extends substantially along one of the opposing trench sidewalls and a second portion that extends substantially along the surface of the substrate, forming a pair of electrically conductive floating gates each having at least a lower portion thereof disposed in the trench adjacent to and insulated from one of the channel region first portions, and forming a pair of electrically conductive control gates each disposed over and insulated from one of the channel region second portions.

Other objects and features of the present invention will become apparent by a review of the specification, claims and appended figures.

BRIEF DESCRIPTION OF THE DRAWINGS

FIG. 1A is a top view of a semiconductor substrate used in the first step of the method of present invention to form isolation regions.

FIG. 1B is a cross sectional view of the structure taken along the line 1B—1B showing the initial processing steps of the present invention.

FIG. 1C is a top view of the structure showing the next step in the processing of the structure of FIG. 1B, in which isolation regions are defined.

FIG. 1D is a cross sectional view of the structure in FIG. 1C taken along the line 1D—1D showing the isolation trenches formed in the structure.

FIG. 1E is a cross sectional view of the structure in FIG. 1D showing the formation of isolation blocks of material in the isolation trenches.

FIG. 1F is a cross sectional view of the structure in FIG. 1E showing the final structure of the isolation regions.

DETAILED DESCRIPTION OF THE PREFERRED EMBODIMENTS

Figure 2A:
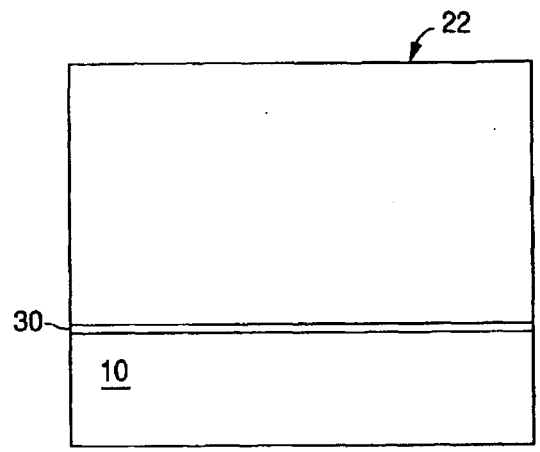
FIGS. 2A–2V are cross sectional views of the semiconductor structure in FIG. 1F taken along the line 2A—2A showing in sequence the steps in the processing of the semiconductor structure in the formation of a non volatile memory array of floating gate memory cells of the present invention.
Figure 3A:
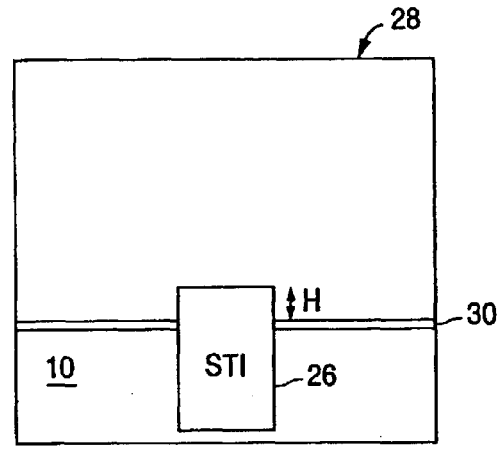
FIGS. 3A–3V are cross sectional views of a periphery region of the semiconductor structure showing in sequence the steps in the processing of the semiconductor structure in the formation of control circuitry for the non volatile memory array of floating gate memory cells of the present invention.
Figure 2B:
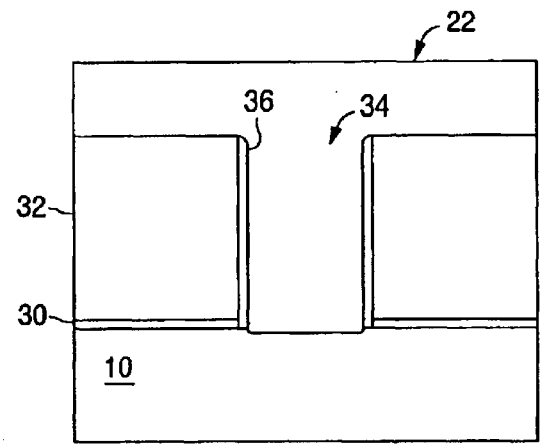
Figure 3B:
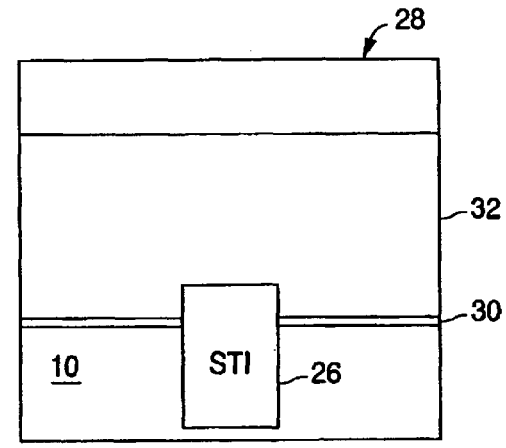
Figures 2E, 3E:
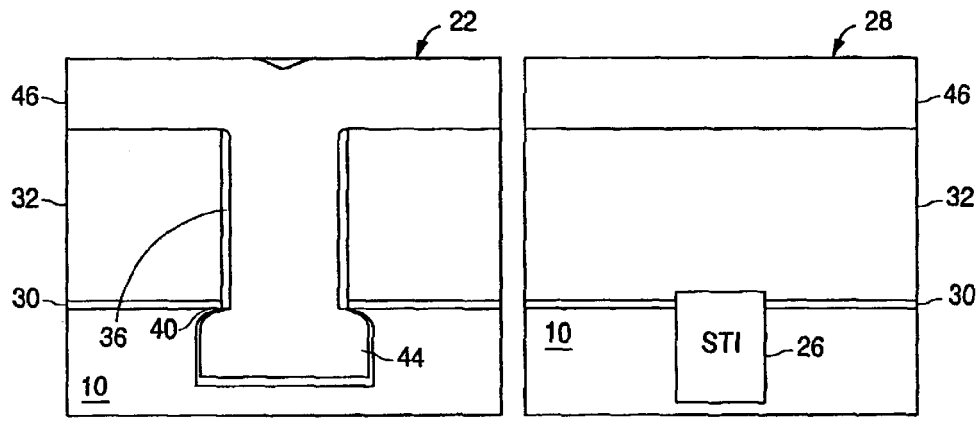
Figures 2F, 3F:
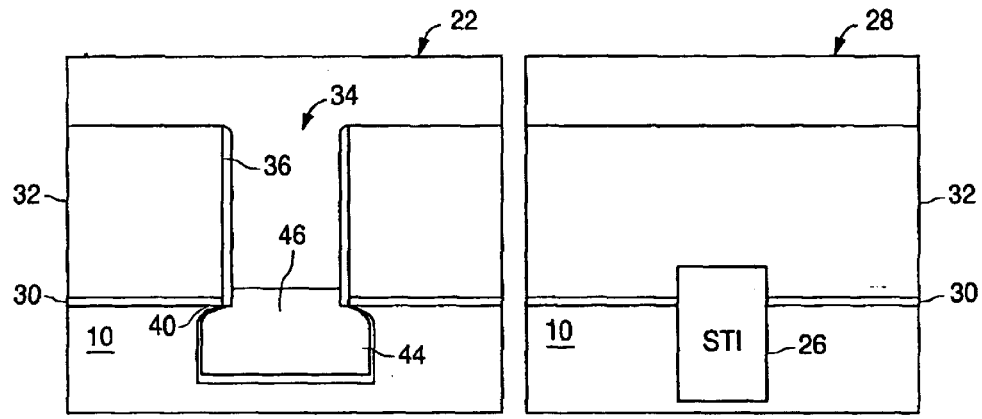
Figures 2G, 3G:
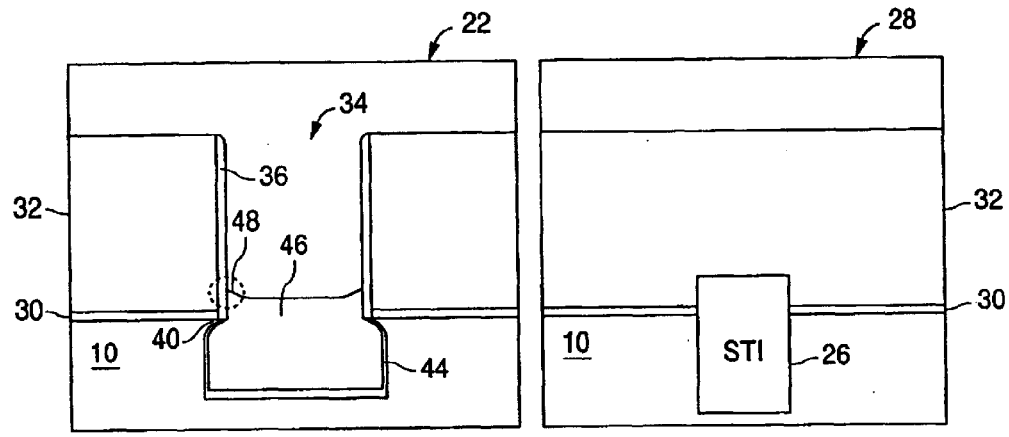
Figures 2H, 3H:
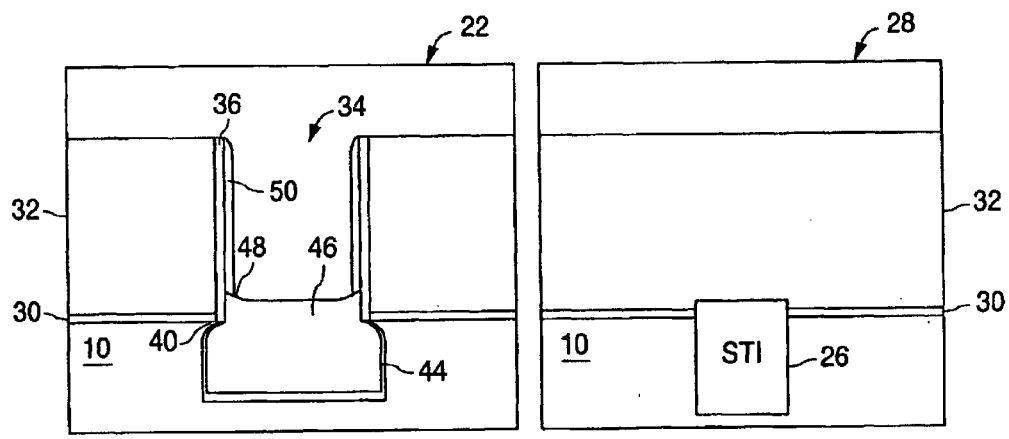
Figure 2I:
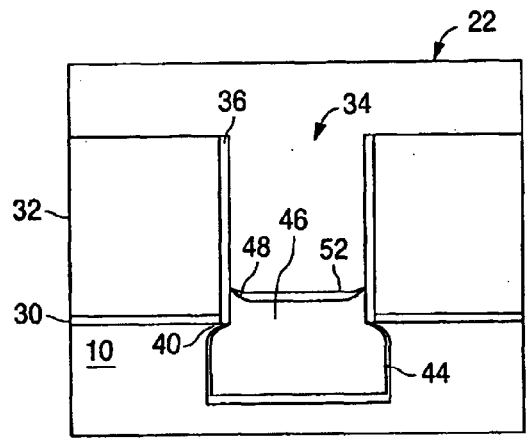
Figure 3I:
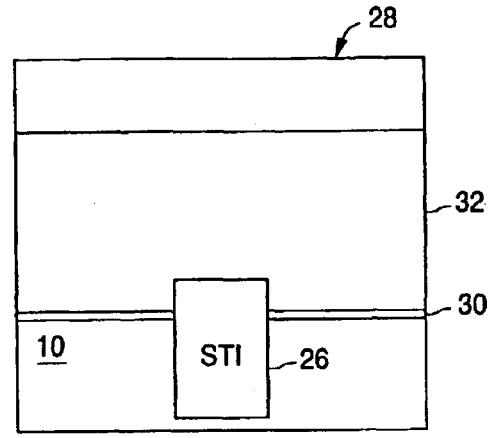
Figure 2J:
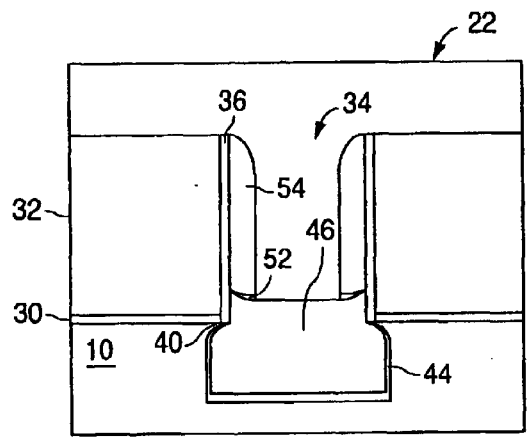
Figure 3J:
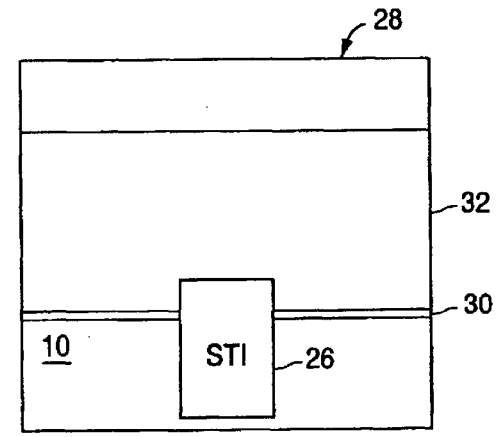
Figures 2K, 3K:
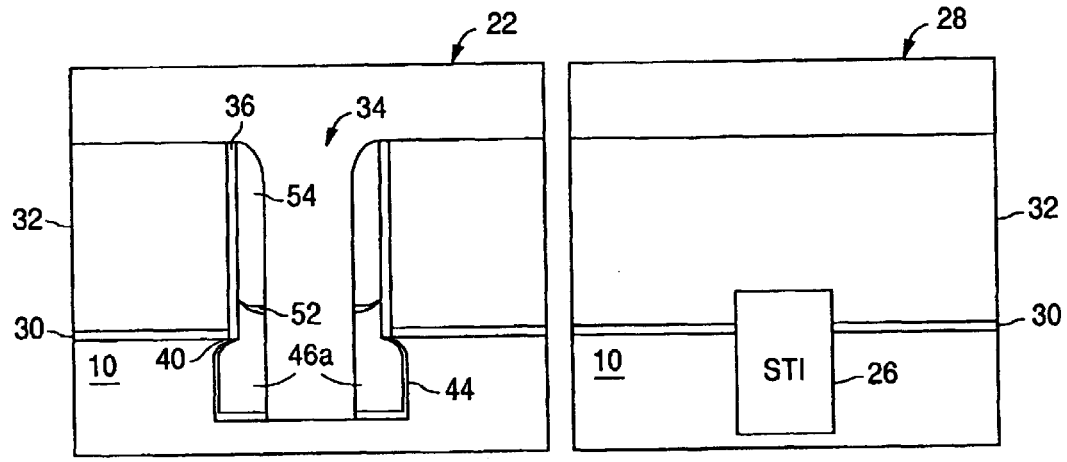
Figures 2L, 3L:
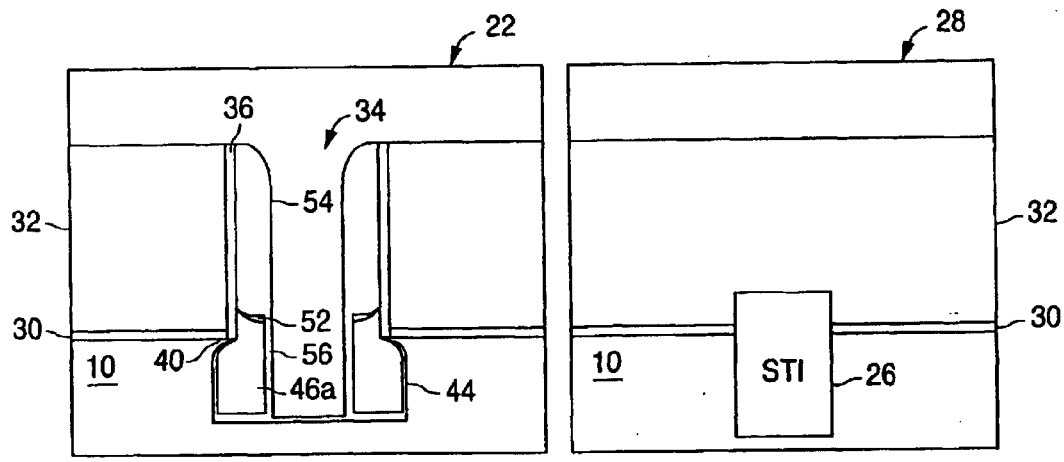
Figures 2Q, 3Q:
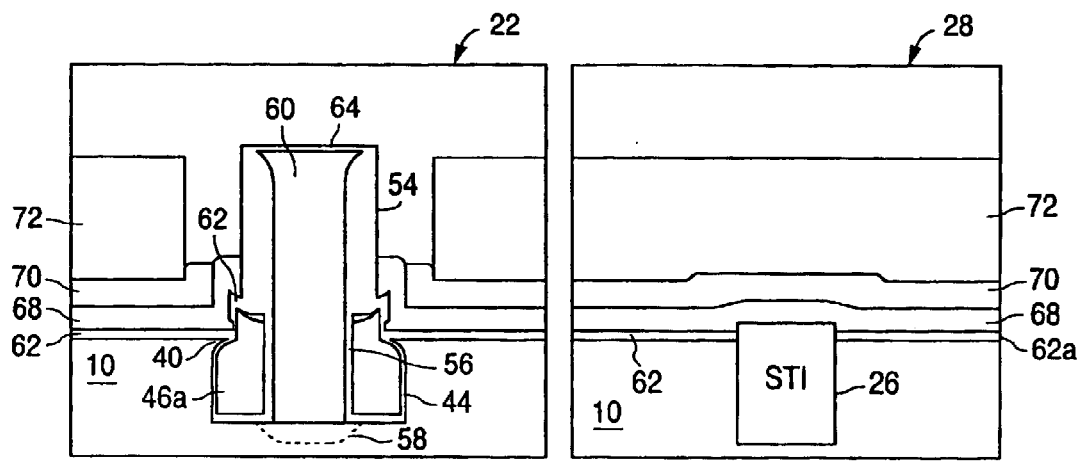

The method of the present invention is illustrated in FIGS. 1A to 1F and 2A to 2Q (which show the processing steps in making the memory cell array of the present invention), and FIGS. 3A–3Q (which show the processing steps in making the periphery region(s) of the semiconductor structure). The method begins with a semiconductor substrate 10, which is preferably of P type and is well known in the art. The thicknesses of the layers described below will depend upon the design rules and the process technology generation. What is described herein is for the 0.10 micron process. However, it will be understood by those skilled in the art that the present invention is not limited to any specific process technology generation, nor to any specific value in any of the process parameters described hereinafter.

Isolation Region Formation

FIGS. 1A to 1F illustrate the well known STI method of forming isolation regions on a substrate. Referring to FIG. 1A there is shown a top plan view of a semiconductor substrate 10 (or a semiconductor well), which is preferably of P type and is well known in the art. First and second layers of material 12 and 14 are formed (e.g. grown or deposited) on the substrate. For example, first layer 12 can be silicon dioxide (hereinafter "oxide"), which is formed on the substrate 10 by any well known technique such as oxidation or oxide deposition (e.g. chemical vapor deposition or CVD) to a thickness of approximately 8–12 nm. Second layer 14 can be silicon nitride (hereinafter "nitride"), which is formed over oxide layer 12 preferably by CVD to a thickness of approximately 80–140 nm. FIG. 1B illustrates a cross-section of the resulting structure.

Once the first and second layers 12/14 have been formed, suitable photo resist material 16 is applied on the nitride layer 14 and a masking step is performed to selectively remove the photo resist material from certain regions (stripes 18) that extend in the Y or column direction, as shown in FIG. 1C. Where the photo-resist material 16 is removed, the exposed nitride layer 14 and oxide layer 12 are etched away in stripes 18 using standard etching techniques (i.e. anisotropic nitride and oxide etch processes) to form trenches 20 in the structure. The distance W between adjacent stripes 18 can be as small as the smallest lithographic feature of the process used. A silicon etch process is then used to extend trenches 20 down into the silicon substrate 10 to a depth of approximately 150–450 nm, as shown in FIG. 1D. Where the photo resist 16 is not removed, the nitride layer 14 and oxide layer 12 are maintained. The resulting structure illustrated in FIG. 1D now defines active regions 22 interlaced with isolation regions 24.

The structure is further processed to remove the remaining photo resist 16. Then, an isolation material such as silicon dioxide is formed in trenches 20 by depositing a thick oxide layer, followed by a Chemical-Mechanical-Polishing or CMP etch (using nitride layer 14 as an etch stop) to remove the oxide layer except for oxide blocks 26 in trenches 20, as shown in FIG. 1E. The remaining nitride and oxide layers 14/12 are then removed using nitride/oxide etch processes, leaving STI oxide blocks 26 extending along isolation regions 24, as shown in FIG. 1F.

The STI isolation method described above is the preferred method of forming isolation regions 24. However, the well known LOCOS isolation method (e.g. recessed LOCOS, poly buffered LOCOS, etc.) could alternately be used, where the trenches 20 may not extend into the substrate, and isolation material may be formed on the substrate surface in stripe regions 18 (e.g. using an oxidation process).

FIGS. 1A to 1F illustrate the memory cell array region of the substrate, in which columns of memory cells will be formed in the active regions 22 that are separated by the isolation regions 24. It should be noted that the substrate 10 also includes at least one periphery region 28 in which control circuitry is formed that will be used to operate the memory cells formed in the memory cell array region. Preferably, isolation blocks 26 are also formed in the periphery region 28 during the same STI or LOCOS process described above.

Memory Cell Formation

Figures 2R, 3R:
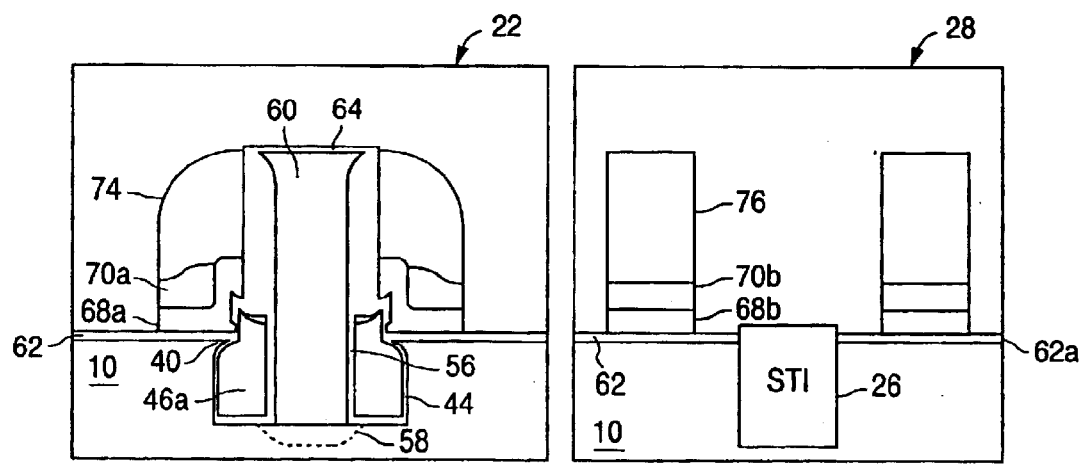
Figures 2S, 3S:
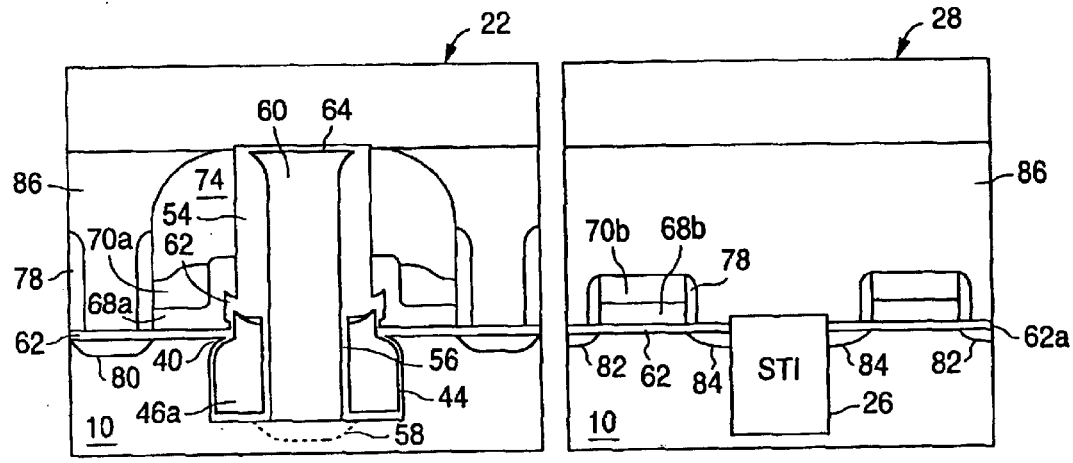
Figures 2T, 3T:
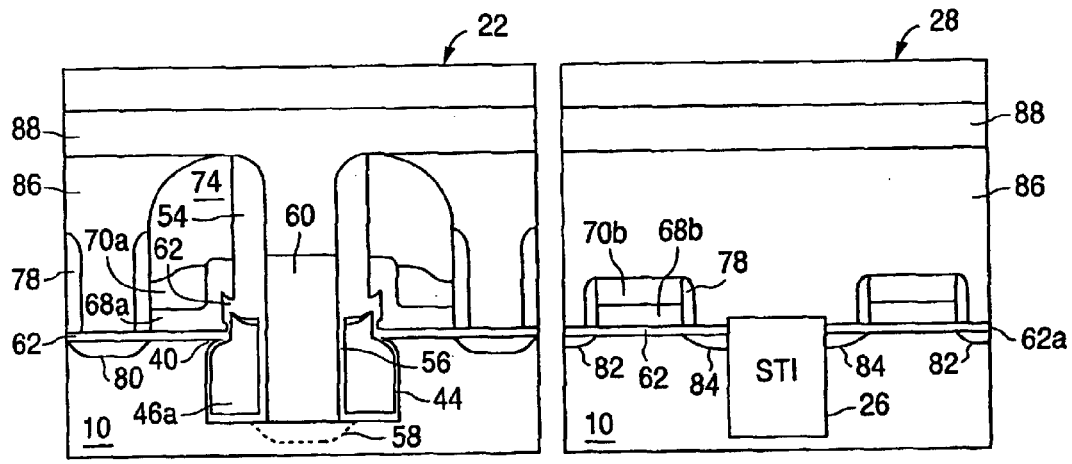
Figure 2U:
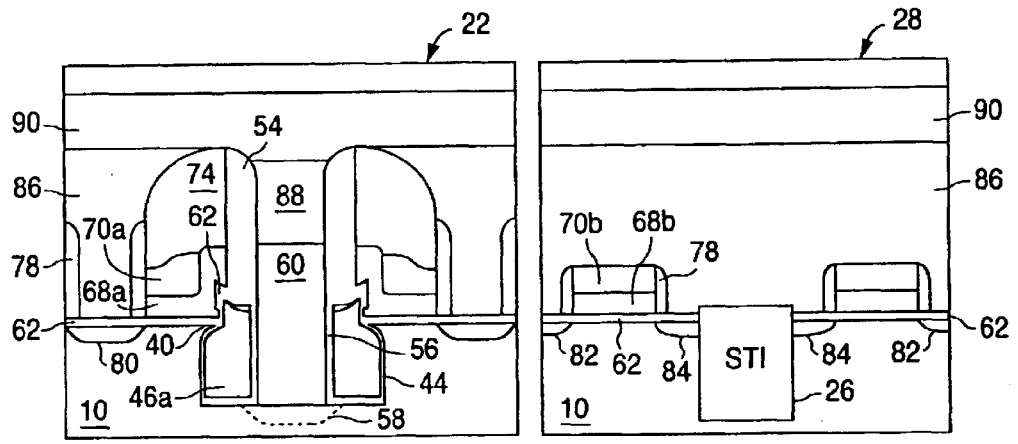
Figure 3U:
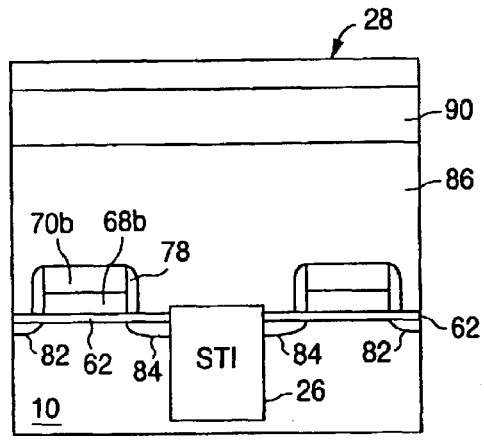
Figure 2V:
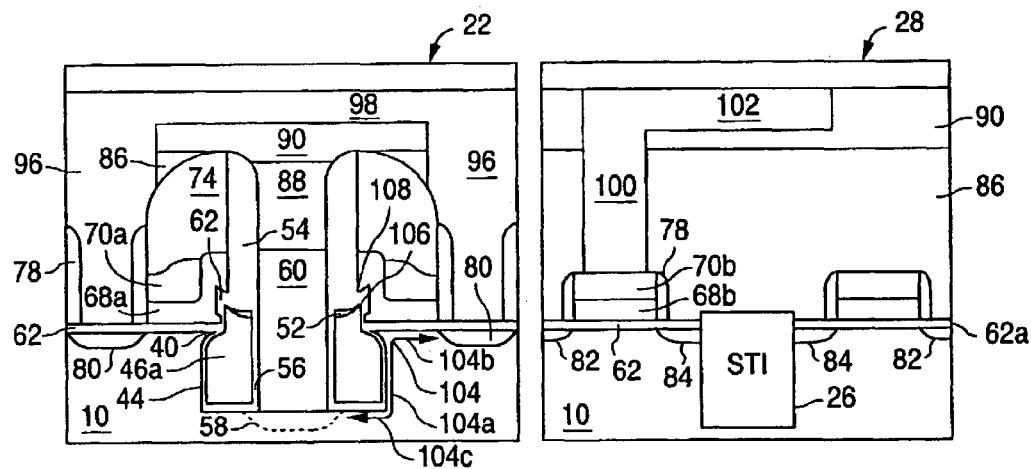
Figure 3V:
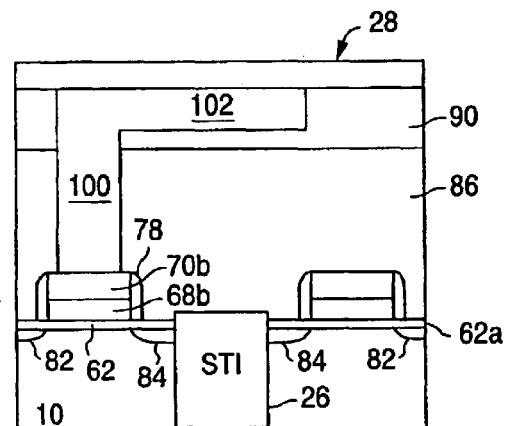

The structure shown in FIG. 1F is further processed as follows. FIGS. 2A to 2V show the cross sections of the structure in the active regions 22 from a view orthogonal to that of FIG. 1F (along line 2A—2A as shown in FIGS. 1C and 1F), and FIGS. 3A to 3V show the cross sections of the structure in the periphery region(s) 28, as the next steps in the process of the present invention are performed concurrently in both regions.

An insulation layer 30 (preferably oxide) is first formed over the substrate 10, as shown in FIGS. 2A and 3A. Oxide layer 30 preferably has a thickness of 8–12 nm, so that STI blocks 26 have a height H relative to that of oxide layer 30 of approximately 80–150 nm. The active region portions of the substrate 10 can be doped at this time for better independent control of the cell array portion of the memory device relative to the periphery region 28. Such doping is often referred to as a Vt implant or cell well implant, and is well known in the art. During this implant, the periphery region is protected by a photo resist layer, which is deposited over the entire structure and removed from just the memory cell array region of the substrate.

Next, a thick layer of hard mask material 32 (e.g. nitride with 3500 Å thickness) is formed over oxide layer 30. A plurality of parallel second trenches 34 are formed in the nitride layer 32 by applying a photo resist (masking) material on the nitride layer 32, and then performing a masking step to remove the photo resist material from selected parallel stripe regions. An anisotropic nitride etch is used to remove the exposed portions of nitride layer 32 in the stripe regions, leaving second trenches 34 that extend down to and expose oxide layer 30. An oxide etch is then performed to remove the exposed portions of oxide layer 30 at the bottom of second trenches 34, leaving portions of substrate 10 exposed. After the photo resist is removed, nitride spacers 36 are then formed along the second trench sidewalls. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. In the present embodiment, spacers 36 are formed by depositing a layer of nitride over the entire structure, followed by an anisotropic nitride etch process, such as the well known Reactive Ion Etch (RIE), to remove the deposited nitride layer except for spacers 36. The resulting active/periphery regions 22/28 are shown in FIGS. 2B/3B.

A silicon anisotropic etch process is next used to extend second trenches 34 down into the substrate 10 (for example, down to a depth of approximately one feature size deep, e.g. about 0.15 um deep with 0.15 um technology). A thermal oxidation process is then used to form an oxide layer 38 (e.g. 200–600 Å thick) along the exposed portions of substrate 10 in second trenches 34. This oxidation process sharpens substrate edges 40 (where the second trench substrate sidewalls now meet the substrate's upper surface at an acute angle—below 90 degrees), because the nitride spacers 36 reduce the affects of the oxidation process on the substrate sidewalls near the substrate's upper surface. The resulting active/periphery regions 22/28 are shown in FIGS. 2C/3C.

A wet oxide etch is performed to remove oxide layer 38, as well as any etch damage and contamination from the exposed substrate material in second trenches 34. Then, a second thermal oxidation process is used to form another oxide layer 42 (e.g. 60–80 Å thick) along the exposed side and bottom walls of second trenches 34 in substrate 10. This oxidation process enhances the sharpness and size of the sharp edges 40, where the second trench substrate sidewalls preferably meet the substrate's upper surface at an angle significantly below 90 degrees (e.g. 75–85 degrees). Another $V_t$ implant or cell well implant can be performed at this time, since the only portions of the substrate not protected by nitride layer 32 are those portions in second trenches 34. The resulting active/periphery regions 22/28 are shown in FIGS. 2D/3D.

Another wet oxide etch is performed to remove oxide layer 42, followed by an oxide formation step to form oxide layer 44 (e.g. 80 Å thick) along the exposed substrate bottom and side walls in second trenches 34. A thick layer of polysilicon 46 (hereinafter "poly") is then formed over the structure, which fills second trenches 34. Poly layer 46 can be doped (e.g. n+) by ion implant, or by an in-situ process. The resulting active/periphery regions 22/28 are shown in FIGS. 2E/3E.

A poly etch process (e.g. a CMP process using nitride layer 32 as an etch stop) is used to remove poly layer 46 except for blocks thereof left remaining in second trenches 34. A controlled poly etch is then used to lower the height of poly blocks 46 down to or below the height of STI oxide blocks 26, as shown in FIGS. 2F/3F. Another poly etch is then performed to create sloped portions 48 on the tops of poly blocks 46 (adjacent the second trench sidewalls), as shown in FIG. 2G. Optional nitride spacers 50 can be formed (e.g. with a nitride deposition and etch process) along the second trench sidewalls and over the sloped portions 48 of poly blocks 46, as shown in FIGS. 2H/3H. The formation of nitride spacers 50 enhances the sharpness of the tips formed by the sloped portions 48 of poly blocks 46, and is therefore optional. Thus, the remaining figures and described processing steps do not include optional nitride spacers 50.

A thermal oxidation process is then performed, which oxidizes the exposed top surfaces of the poly blocks 46 (forming oxide layer 52 thereon), which also enhances the sloped portions 48 and the sharpness of the edges formed thereby, as shown in FIG. 2I. Oxide spacers 54 are then formed along the sidewalls of the second trenches 34 by depositing oxide over the structure (e.g. approximately 350 Å thickness) followed by an anisotropic oxide etch. The oxide etch also removes the center portion of oxide layer 52 in each of the second trenches 34. The periphery region 28 is left unaffected. The resulting active/periphery regions 22/28 are shown in FIGS. 2J/3J.

An anisotropic poly etch is next performed, which removes the center portions of the poly blocks 46 that are not protected by oxide spacers 54, leaving a pair of opposing poly blocks 46a in each of the second trenches 34, as shown in FIG. 2K. An insulation deposition and anisotropic etchback process is then used to form an insulation layer 56 (e.g. 150 Å thick) along the exposed sides of poly blocks 46a. The insulation layer 56 could be formed with any appropriate insulation material (e.g. ONO—oxide/nitride/oxide, or other high dielectric materials). Preferably, the insulation material is oxide, so that the oxide deposition/etch process also thickens the oxide spacers 54 and results in the partial or complete removal of the exposed portions of oxide layer 44 at the bottom of each second trench 34, as shown in FIGS. 2L/3L.

Suitable ion implantation (and possible anneal) is then made across the surface of the structure to form first (source) regions 58 in the exposed substrate portions at the bottom of second trenches 34. The source regions 58 are self aligned to the second trenches 34, and have a second conductivity type (e.g. N type) that is different from a first conductivity type of the substrate or substrate well (e.g. P type). The ions have no significant effect on the nitride layer 32. An anisotropic oxide etch, if needed, is performed to remove any exposed oxide on the bottom surface of the second trenches 34 to ensure the substrate is exposed. The resulting active/ periphery regions 22/28 are shown in FIGS. 2M/3M.

A poly deposition step (preferably in-situ doped), followed by a poly CMP etch (using the nitride layer 32 as an etch stop) are used to fill second trenches 34 with poly blocks 60, as shown in FIG. 2N. A nitride etch follows, which removes nitride layer 32 and nitride spacers 36, and exposes upper side portions of the poly blocks 46a (in the active regions 22) and the STI oxide block 26 (in the periphery region 28). A wet oxide etch is preferably used to remove oxide layer 30 over substrate 10. An optional masking and oxide etch step can be used at this point to reduce the height of STI oxide block 26 as needed for logic devices formed in the periphery region 28. A tunnel oxide layer 62 is next formed on the exposed upper side portions of poly blocks 46a and on the exposed portions of substrate 10, either by thermal oxidation, oxide deposition, or both. This oxide formation step also forms an oxide layer 64 (e.g. greater than 400 Å thick) on the exposed top surfaces of poly blocks 60. Optional $V_t$ implantation in the periphery region 28 can be performed at this time by masking off the active regions 22. The resulting active/periphery regions 22/28 are shown in FIGS. 2O/3O.

The oxide layer 62 serves as the gate oxide for both the memory cells in the active regions 22, and the control circuitry in the periphery region 28. For each device, the thickness of the gate oxide dictate's its maximum operating voltage. Thus, if it is desired that some of the control circuitry operate at a different voltage than the memory cells or other devices of the control circuitry, then the thickness of the gate oxide 32 can be modified at this point in the process. In way of example but not limitation, photo resist 66 can be formed over the structure, followed by a masking step for selectively removing portions of the photo resist in the periphery region to expose portions of oxide layer 62. The exposed portions of oxide layer 62 can be thinned (e.g. by using a controlled etch) or replaced (e.g. by an oxide etch and oxide deposition) with oxide layer 60a having the desired thickness, as illustrated in FIGS. 2P/3P.

After removal of photo resist 66, a poly deposition step is used to form a poly layer 68 over the structure (e.g. approximately 500 Å thick, preferably in-situ doped). Then, another deposition step is used to form a layer of metalized polysilicon 70 over poly layer 68. Photo resist is then deposited over the structure, and etched back leaving a layer of photo resist 72 (e.g. 800–1200 Å thick) having an upper surface that is disposed preferably below the tops of the oxide spacers 54, leaving exposed those portions of the poly layers 68/70 extending up and over oxide spacers 54. A poly etch process is then used to remove exposed portions of poly layers 68/70, and recess the upper portions of these poly layers down below the tops of oxide spacers 54, but above the tops of poly blocks 46a. The resulting structures are shown in FIGS. 2Q/3Q.

After the photo resist 72 is removed, nitride spacers 74 are formed against oxide spacers 54 (and over portions of poly layers 68/70 adjacent to the oxide spacers 54) by depositing a layer of nitride (e.g. 1300 to 1500 Å thickness) over the structure, followed by an anisotropic nitride etch which leaves the nitride spacers 74 (e.g. ~1300 Å wide). Photo resist deposition and masking steps follow to form blocks of photo resist 76 on the poly layers 68/70 in the periphery region 28. An anisotropic poly etch is then used to remove exposed portions of poly layers 68/70 (i.e. those portions not protected by nitride spacers 74 or photo resist blocks 76), leaving poly blocks 68a and 70a under nitride spacers 74 (in the active regions 22) and poly blocks 68b and 70b under photo resist blocks 76 (in periphery region 28). The resulting structures are shown in FIGS. 2R/3R.

After the photo resist blocks 76 are removed, lightly doped drain implants for low voltage and high voltage transistors (e.g. PHDD:LDD for high voltage PMOS devices, and NHDD:LDD for low voltage NMOS devices) are preferably performed at this time, where selected portions of the periphery regions are left unmasked while implants are made adjacent to selected poly blocks 68b/70b. Insulation (e.g. nitride) spacers 78 are next formed against poly blocks 68a/70a and 68b/70b by depositing a layer of nitride (e.g. 200–300 Å thick via CVD), followed by an anisotropic nitride etch. Suitable ion implantation (and anneal) is used to form second (drain) regions 80 in the substrate active regions 22 and source/drain regions 82/84 in the substrate periphery region 28 for the devices therein. An optional metalization step (not shown) can be used to form conductive metalized silicon (silicide) over the source/drain regions 80/82/84 by removing exposed portions of oxide layer 62/62a, depositing a metal such as tungsten, cobalt, titanium, nickel, platinum, or molybdenum over the active and periphery regions 22/28, and annealing the structures to permit the hot metal to flow and to seep into the exposed top portions of substrate 10. Insulation material 86, such as ILD (Inter-layer dielectrics) is then formed over the entire structure, followed by a reflow and planarization etch (e.g. CMP etch using nitride spacers 74 as an etch stop) process, resulting in the structures shown in FIGS. 2S/3S.

An oxide etch is used next to remove oxide layer 64 over poly blocks 60. The exposed upper portions of poly blocks 60 (between the oxide spacers 54) are then removed using a poly etch, and replaced with tungsten/titanium-nitride 88 that is deposited over the structure (e.g. by CVD), as shown in FIGS. 2T/3T. A tungsten/titanium-nitride etch (using nitride spacers 74 as an etch stop) is used to remove the tungsten/titanium-nitride 88 except those portions over poly blocks 60. A short tungsten/titanium-nitride etch follows to recess the remaining blocks of tungsten/titanium-nitride 88 below the tops of nitride spacers 74. Another layer of insulation material (e.g. ILD) 90 is then formed over the structure. The resulting structures are shown in FIGS. 2U/3U.

A dual damascene metalization scheme is preferably used next, which includes the application of a first contact mask leaving only the areas over the drain regions 80 (in the active regions 22) and over select poly blocks 68b/70b (in the periphery regions 28) exposed, followed by an ILD etch to form contact openings through the insulation layers 86/90 to expose drain regions 80 and select poly blocks 68b/70b. A second contact mask is applied leaving only those areas of insulation layer 90 exposed in which contact lines are to be formed, followed by an ILD etch to form contact trenches in insulation layer 90. The contact openings and contact trenches are then filled with a conductor metal (e.g. tungsten, molybdenum, etc.) by a metal deposition and etch back process to form metal contacts 96 that are electrically connected to drain regions 80, metal contact lines 98 connecting together all the contacts 96 in each of the active regions 22, metal contacts 100 that are electrically connected to selected poly blocks 68b/70b, and metal contact lines 102 connected to the metal contacts 100. The final active region memory cell structure is illustrated in FIG. 2V, and the final periphery region control circuitry structure is illustrated in FIG. 3V.

As shown in FIG. 2V, the process of the present invention forms pairs of memory cells that mirror each other, with a memory cell formed on each side of the poly block 60. For each memory cell, first and second regions 58/80 form the source and drain regions respectively (although those skilled in the art know that source and drain can be switched during operation). Channel regions 104 for each memory cell are defined in the surface portion of the substrate that is in-between the source and drain 58/80. Each channel region 104 includes two portions joined together at an approximate right angle, with a first (vertical) portion 104a extending along the vertical wall of filled second trench 34 and a second (horizontal) portion 104b extending between the sidewall of filled second trench 34 and the drain region 80. To the extent source region 58 does not fully occupy the substrate underneath second trench 34, the channel region includes a third portion 104c extending from the channel region vertical portion 104a to the source region 58. Each pair of memory cells share a common source region 58 that is disposed underneath filled second trench 34 and is in electrical contact with poly block 60. Similarly, each drain region 80 is shared between adjacent memory cells from different mirror sets of memory cells.

For each memory cell, poly block 46a constitutes the floating gate, which is disposed adjacent to the channel region portions 104a/104c and insulated therefrom by oxide layer 44, and adjacent to (source) poly block 60 and insulated therefrom by oxide layer 56. Poly blocks 68a/70a constitute the control gate, which is disposed over channel region portion 104b and insulated therefrom by oxide layer 62, and adjacent to floating gate 46a and insulated therefrom by oxide layer 62. Each floating gate 46a preferably includes an upper portion that extends above the substrate surface and terminates in an edge 106 that faces and is insulated from an edge 108 of one of the control gates 68a/70a, thus providing a path for Fowler-Nordheim tunneling through oxide layer 62. Control gates 68a/70a each have a lower portion disposed laterally adjacent to (and insulated from) the floating gate upper portion, and an upper portion disposed over (and insulated from) the floating gate upper portion. Poly blocks 60 each extend along and are insulated (by oxide layer 56) from floating gates 46a, for enhanced voltage coupling therebetween.

Figure 4:
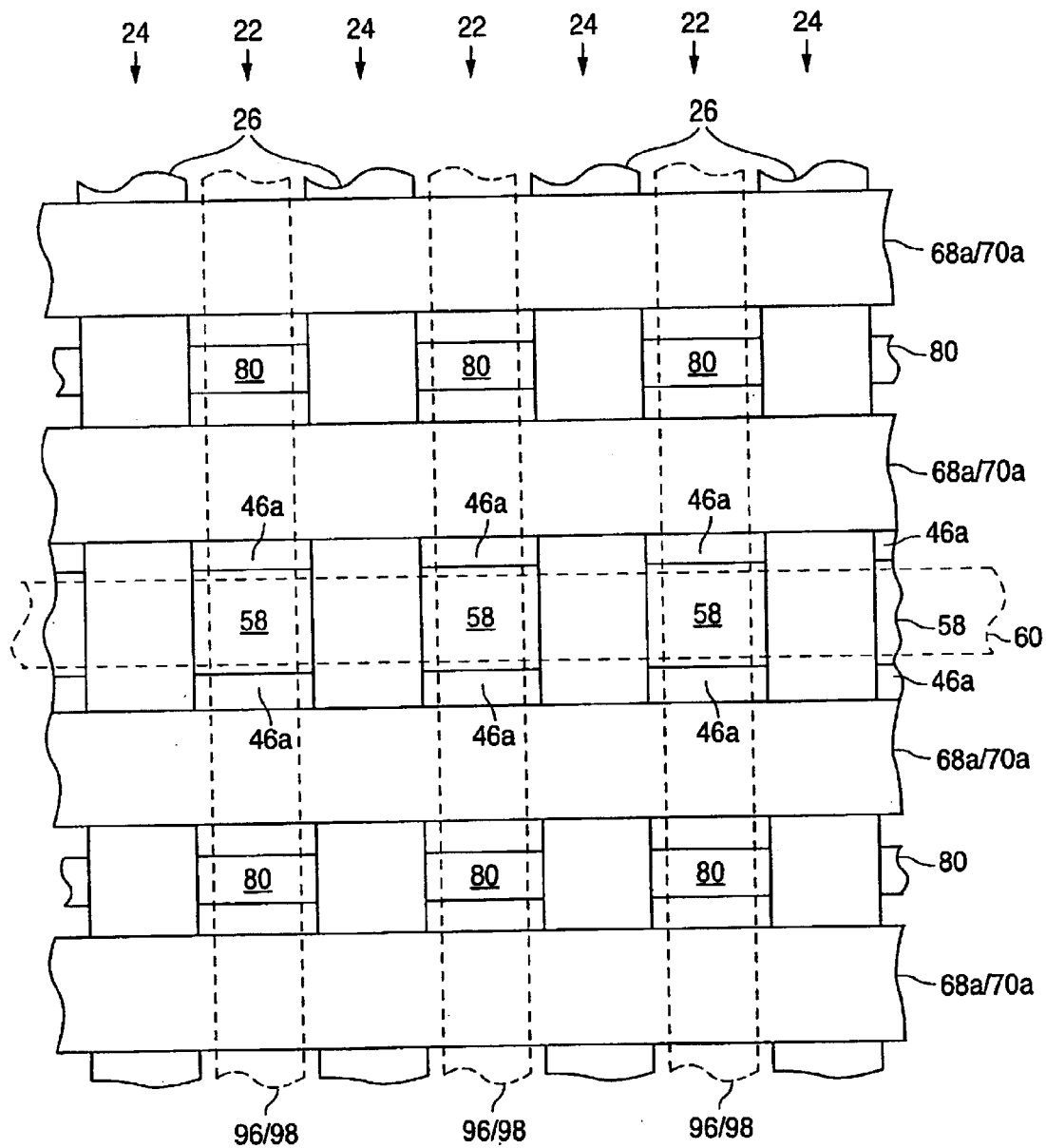
FIG. 4 is a top plan view of the memory cell array of the present invention.

FIG. 4 is a top view of the resulting structure. Contacts 96 and contact lines 98 form conductive drain (bit) lines that electrically connect together all the drain regions 80 in each active region 22. Control gates 68a/70a are continuously formed as conductive word lines that extend across both the active and isolation regions 22/24 to electrically connect together all the control gates in each row of memory cells. The above described process does not produce source regions 52 that extend across the isolation regions 24 (which can easily be done by removing the STI insulation material from the isolation region portions of second trenches 34 before ion implantation). However, poly blocks 60 (which are in electrical contact with source regions 52) are formed continuously across the isolation regions to adjacent active regions, and form conductive source lines each of which electrically connecting together all the source regions 52 in each row of paired memory cells.

Memory Cell Operation

The operation of the memory cells will now be described. The operation and theory of operation of such memory cells are also described in U.S. Pat. No. 5,572,054, whose disclosure is incorporated herein by reference with regard to the operation and theory of operation of a non-volatile memory cell having a floating gate and a control gate, floating gate to control gate tunneling, and an array of memory cells formed thereby.

To initially erase a selected memory cell in any given active region 22, a ground potential is applied to both its source 58 and drain 80. A high-positive voltage (e.g. +8 volts) is applied to the control gate 68a/70a. Electrons on the floating gate 46a are induced through the Fowler-Nordheim tunneling mechanism to tunnel from the upper end of the floating gate 46a (primarily from edge 106), through the oxide layer 62, and onto the control gate 68a/70a (primarily through edge 108), leaving the floating gate 46a positively charged. Tunneling is enhanced by the sharpness of edges 106/108. It should be noted that since each of the control gates 68a/70a extends across the active and isolation regions as continuous word lines, one memory cell in each active region is 'erased' at the same time.

When a selected memory cell is desired to be programmed, a small voltage (e.g. 0.5 to 1.0 V) is applied to its drain region 80. A positive voltage level in the vicinity of the threshold voltage of the MOS structure (on the order of approximately +1.4 volts) is applied to its control gate 68a/70a. A positive high voltage (e.g. on the order of 5 or 6 volts) is applied to its source region 58. Electrons generated by the drain region 80 will flow therefrom towards the source region 58 through the deeply depleted horizontal portion 104b of the channel region 104. As the electrons reach the vertical portion 104a of the channel region 104, they will see the high potential of floating gate 46a (because the floating gate 46a is strongly voltage-coupled to the positively charged source region 58 and poly block 60). The electrons will accelerate and become heated, with most of them being injected into and through the insulating layer 44 and onto the floating gate 46a. Programming efficiency is further enhanced by an injector tip formed by the substrate sharp edge 40, which focuses and more efficiently injects the electrons toward the floating gate 46a, thus reducing the time and source voltage needed to program the memory cell, as well as improving the dielectric integrity lifetime by lowering the field voltage per area. Low or ground potential are applied to the source/drain regions 58/80 and control gates 68a/70a for memory cell rows/columns not containing the selected memory cell. Thus, only the memory cell in the selected row and column is programmed.

The injection of electrons onto the floating gate 46a will continue until the reduction of the charge on the floating gate 46a can no longer sustain a high surface potential along the vertical channel region portion 104a to generate hot electrons. At that point, the electrons or the negative charges in the floating gate 46a will decrease the electron flow from the drain region 80 onto the floating gate 46a.

Finally, to read a selected memory cell, ground potential is applied to its source region 58. A read voltage (e.g. ~1 volt) is applied to its drain region 80 and approximately 1.5 to 3.3 volts (depending upon the power supply voltage of the device) is applied to its control gate 68a/70a. If the floating gate 46a is positively charged (i.e. the floating gate is discharged of electrons), then the channel region portions 104a/104c (directly adjacent to the floating gate 46a) are turned on. When the control gate 68a–70a is raised to the read potential, the horizontal channel region portion 104b (directly adjacent the control gate 68a/70a) is also turned on. Thus, the entire channel region 104 will be turned on, causing electrons to flow from the source region 58 to the drain region 80. This sensed electrical current would be the "1" state.

On the other hand, if the floating gate 46a is negatively charged, the channel region portions 104a/104c are either weakly turned on or are entirely shut off. Thus, when the control gate 68a/70a and the drain region 80 are raised to the read potential, little or no current will flow through channel region portions 104a/104c. In this case, either the current is very small compared to that of the "1" state or there is no current at all. In this manner, the memory cell is sensed to be programmed at the "0" state. Ground potential is applied to the source/drain regions 58/80 and control gates 68a/70a for non-selected columns and rows so only the selected memory cell is read.

The memory cell array includes peripheral circuitry including conventional row address decoding circuitry, column address decoding circuitry, sense amplifier circuitry, output buffer circuitry and input buffer circuitry, which are well known in the art.

The present invention provides a memory cell array with reduced size and superior program efficiency. Memory cell size is reduced significantly because the source regions 58 are buried inside the substrate 10, and are self aligned to the second trenches 34, where space is not wasted due to limitations in the lithography generation, contact alignment and contact integrity. Each floating gate 46a has a lower portion disposed in second trench 34 formed in the substrate for receiving the tunneling electrons during the program operation and for turning on the channel region portions 104a/104c during the read operation. Each floating gate 46a also has an upper portion that preferably extends up above the substrate surface and terminates in an edge 106 facing the control gate edge 108 for Fowler Nordheim tunneling therebetween during the erase operation.

Program efficiency is greatly enhanced by "aiming" the horizontal portion 104b of the channel region 104 and the injector tip (sharp edge) 40 of substrate 10 at the floating gate 46a. In conventional programming schemes, the electrons in the channel region flow in a path parallel to the floating gate, where a relatively small number of the heated electrons are injected onto the floating gate. The estimated program efficiency (number of electrons injected compared to total number of electrons) in such conventional programming schemes is estimated at about 1/1000. However, because the horizontal channel region portion 104b and injector tip (sharp edge) 40 define a focused electron path that is 'aimed' directly at the floating gate, the program efficiency of the present invention is estimated to be closer to 1/1, even with reduced programming voltages.

Also with the present invention, there is also an enhanced voltage coupling between each floating gate 46a and the corresponding source region 58 via the poly block 60 (electrically connected with the source region 58). At the same time, there is relatively low voltage coupling between the floating gate 46a and the control gate 68a/70a. Furthermore, having source region 58 and drain region 80 separated vertically as well as horizontally allows for easier optimization of reliability parameters without affecting cell size.

It is to be understood that the present invention is not limited to the embodiment(s) described above and illustrated herein, but encompasses any and all variations falling within the scope of the appended claims. For example, trenches 20/34 can end up having any shape that extends into the substrate, not just the elongated rectangular shape shown in the figures. Also, although the foregoing method describes the use of appropriately doped polysilicon as the conductive material used to form the memory cell components, it should be clear to those having ordinary skill in the art that in the context of this disclosure and the appended claims, "polysilicon" refers to any appropriate conductive material that can be used to form the elements of non-volatile memory cells. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows for the proper formation of the memory cell of the present invention. Additionally, the above described invention is shown to be formed in a substrate which is shown to be uniformly doped, but it is well known and contemplated by the present invention that memory cell components can be formed in well regions of the substrate, which are regions that are doped to have a different conductivity type compared to other portions of the substrate. Poly blocks 60 can be insulated from source regions 58, where poly blocks 60 act as "coupling gates" that can be raised to a higher voltage level than the source region program voltage, for even more capacitive coupling with the floating gates for enhanced programming efficiency. Lastly, single layers of insulating or conductive material could be formed as multiple layers of such materials, and vice versa.

What is claimed is:

1. An electrically programmable and erasable memory device comprising:
    a substrate of semiconductor material having a first conductivity type and a surface;
    a trench formed into the surface of the substrate, wherein the trench includes a sidewall that meets the substrate surface at an acute angle to form a sharp edge;
    first and second spaced-apart regions formed in the substrate and having a second conductivity type, with a channel region formed in the substrate therebetween, wherein the first region is formed underneath the trench, and the channel region includes a first portion that extends substantially along the trench sidewall and a second portion that extends substantially along the substrate surface;
    an electrically conductive floating gate having at least a lower portion thereof disposed in the trench adjacent to and insulated from the channel region first portion; and
    an electrically conductive control gate disposed over and insulated from the channel region second portion;
    wherein the channel region first and second portions are non-linear with respect to each other, with the channel region second portion extending from the second region in a direction toward the sharp edge and the floating gate to define a path for programming the floating gate with electrons via hot electron injection.

2. The device of claim 1, further comprising:
    a block of conductive material having at least a lower portion thereof disposed in the trench adjacent to and insulated from the floating gate.

3. The device of claim 2, wherein the conductive material block is electrically connected to the first region.

4. The device of claim 2, further comprising:
    a spacer of insulating material disposed between the control gate and the block of conductive material, and over the floating gate.

5. The device of claim 1, wherein:
    the floating gate includes an upper portion that terminates in an edge; and
    the control gate includes an edge that faces the floating gate edge.

6. The device of claim 5, wherein:
    the floating gate upper portion extends above the substrate surface;
    the control gate has a first portion that is disposed laterally adjacent to and insulated from the floating gate upper portion; and
    the control gate has a second portion that is disposed over and insulated from the floating gate upper portion.

7. The device of claim 1, wherein the channel region includes a third portion extending substantially along at least a portion of a bottom surface of the trench, and wherein the floating gate is disposed over and insulated from the channel region third portion.

8. The device of claim 1, wherein the control gate includes:
    a layer of polysilicon disposed over and insulated from the channel region second portion and disposed laterally adjacent to and insulated from at least a portion of the floating gate; and
    a layer of metalized polysilicon disposed on the polysilicon layer.

9. The device of claim 1, wherein the trench sidewall meets the substrate surface at an angle substantially less than 90 degrees.

10. An electrically programmable and erasable memory device comprising:
    a substrate of semiconductor material having a first conductivity type and a surface;
    a trench formed into the surface of the substrate, wherein the trench includes a sidewall that meets the substrate surface at an acute angle to form a sharp edge, and wherein the sharp edge is formed by the process of:
        forming a first oxide layer on the trench sidewall via oxidation,
        removing the first oxide layer, and
        forming a second oxide layer on the trench sidewall via oxidation;
    first and second spaced-apart regions formed in the substrate and having a second conductivity type, with a channel region formed in the substrate therebetween, wherein the first region is formed underneath the trench, and the channel region includes a first portion that extends substantially along the trench sidewall and a second portion that extends substantially along the substrate surface;
    an electrically conductive floating gate having at least a lower portion thereof disposed in the trench adjacent to and insulated from the channel region first portion; and
    an electrically conductive control gate disposed over and insulated from the channel region second portion;
    wherein the channel region first and second portions are non-linear with respect to each other, with the channel region second portion extending from the second region in a direction toward the sharp edge and the floating gate to define a path for programming the floating gate with electrons via hot electron injection.

11. The device of claim 10, further comprising:
    a block of conductive material having at least a lower portion thereof disposed in the trench adjacent to and insulated from the floating gate.

12. The device of claim 11, wherein the conductive material block is electrically connected to the first region.

13. The device of claim 11, further comprising:
a spacer of insulating material disposed between the control gate and the block of conductive material, and over the floating gate.

14. The device of claim 10, wherein:
the floating gate includes an upper portion that terminates in an edge; and
the control gate includes an edge that faces the floating gate edge.

15. The device of claim 14, wherein:
the floating gate upper portion extends above the substrate surface;
the control gate has a first portion that is disposed laterally adjacent to and insulated from the floating gate upper portion; and
the control gate has a second portion that is disposed over and insulated from the floating gate upper portion.

16. The device of claim 10, wherein the channel region includes a third portion extending substantially along at least a portion of a bottom surface of the trench, and wherein the floating gate is disposed over and insulated from the channel region third portion.

17. The device of claim 10, wherein the control gate includes:
a layer of polysilicon disposed over and insulated from the channel region second portion and disposed laterally adjacent to and insulated from at least a portion of the floating gate; and
a layer of metalized polysilicon disposed on the polysilicon layer.

18. The device of claim 10, wherein the trench sidewall meets the substrate surface at an angle substantially less than 90 degrees.

19. An array of electrically programmable and erasable memory devices comprising:
a substrate of semiconductor material having a first conductivity type and a surface;
spaced apart isolation regions formed on the substrate which are substantially parallel to one another and extend in a first direction, with an active region between each pair of adjacent isolation regions; and
each of the active regions including a plurality of pairs of memory cells, wherein each of the memory cell pairs comprises:
a trench formed into the surface of the substrate and including a pair of opposing sidewalls that meet the substrate surface at acute angles to form a pair of sharp edges,
a first region formed in the substrate underneath the trench,
a pair of second regions formed in the substrate, with a pair of channel regions each formed in the substrate between the first region and one of the second regions, wherein the first and second regions have a second conductivity type, and wherein each of the channel regions includes a first portion that extends substantially along one of the opposing trench sidewalls and a second portion that extends substantially along the substrate surface,
a pair of electrically conductive floating gates each having at least a lower portion thereof disposed in the trench adjacent to and insulated from one of the channel region first portions, and
a pair of electrically conductive control gates each disposed over and insulated from one of the channel region second portions,
wherein for each of the channel regions, the channel region first and second portions are non-linear with respect to each other, with the channel region second portion extending from one of the second regions in a direction toward one of the sharp edges and one of the floating gates to define a path for programming the one floating gate with electrons via hot electron injection.

20. The array of claim 19, wherein each of the memory cell pairs further comprises:
a block of conductive material having at least a lower portion thereof disposed in the trench adjacent to and insulated from the pair of floating gates.

21. The array of claim 20, wherein each of the conductive material blocks is electrically connected to one of the first regions.

22. The array of claim 21, further comprising:
a plurality of conductive source lines of conductive material each extending across the active and isolation regions in a second direction perpendicular to the first direction and each electrically connecting together one of the conductive blocks from each of the active regions.

23. The array of claim 20, wherein each of the memory cell pairs further comprises:
a pair of spacers of insulating material each disposed between the block of conductive material and one of the control gates, and over one of the floating gates.

24. The array of claim 19, wherein:
each of the floating gates includes an upper portion that terminates in an edge; and
each of the control gates includes an edge that faces one of the floating gate edges.

25. The array of claim 24, wherein:
each of the floating gate upper portions extends above the substrate surface;
each of the control gates has a first portion that is disposed laterally adjacent to and insulated from one of the floating gate upper portion; and
each of the control gates has a second portion that is disposed over and insulated from one of the floating gate upper portions.

26. The array of claim 19, wherein each of the channel regions includes a third portion extending substantially along at least a portion of a bottom surface of one of the trenches, and wherein each of the floating gates is disposed over and insulated from one of the channel region third portions.

27. The array of claim 19, wherein each of the control gates includes:
a layer of polysilicon disposed over and insulated from one of the channel region second portions and disposed laterally adjacent to and insulated from at least a portion of one of the floating gates; and
a layer of metalized polysilicon disposed on the polysilicon layer.

28. The array of claim 19, wherein each of the trench sidewalls meets the substrate surface at an angle substantially less than 90 degrees.

29. The array of claim 19, further comprising:
a plurality of conductive control lines of conductive material each extending across the active and isolation regions in a second direction perpendicular to the first direction and each electrically connecting together one of the control gates from each of the active regions.

* * * * *

UNITED STATES PATENT AND TRADEMARK OFFICE
CERTIFICATE OF CORRECTION

PATENT NO.    : 6,873,006 B2
DATED         : March 29, 2005
INVENTOR(S)   : Bomy Chen et al.

It is certified that error appears in the above-identified patent and that said Letters Patent is hereby corrected as shown below:

<u>Title page,</u>
Item [54], Title, "SEMICONDUCTOR MEMORY ARRAY OF FLOATING GATE MEMORY CELLS WITH BURRIED FLOATING GATE POINTED CHANNEL REGION" should read -- SEMICONDUCTOR MEMORY ARRAY OF FLOATING GATE MEMORY CELLS WITH BURIED FLOATING GATE AND POINTED CHANNEL REGION --.

Signed and Sealed this

Twenty-eighth Day of June, 2005

JON W. DUDAS
*Director of the United States Patent and Trademark Office*